US005978274A

United States Patent [19]

Wang

[11] Patent Number: 5,978,274

[45] Date of Patent: Nov. 2, 1999

[54] METHOD FOR ERASING SPLIT-GATE FLASH MEMORY

[75] Inventor: Lin-Song Wang, Hsinchu, Taiwan

[73] Assignees: Winbond Electronics Corp.; Worldwide Semiconductor Manufacturing Co., both of Hsinchu, Taiwan; a part interest

[21] Appl. No.: 09/128,217

[22] Filed: Aug. 3, 1998

[51] Int. Cl.[6] .................... G11C 16/04

[52] U.S. Cl. .................... 365/185.29; 365/185.28; 365/185.14; 365/185.01; 365/185.15

[58] Field of Search .................... 365/185.29, 185.28, 365/185.01, 185.14, 185.16, 185.15

[56] References Cited

U.S. PATENT DOCUMENTS

| | | | |
|---|---|---|---|
| 5,212,541 | 5/1993 | Bergemont | 257/319 |
| 5,280,446 | 1/1994 | Ma et al. | 365/218 |
| 5,712,180 | 1/1998 | Guterman et al. | 437/43 |
| 5,801,993 | 9/1998 | Choi | 365/185.28 |
| 5,847,996 | 12/1998 | Guterman et al. | 365/185.28 |
| 5,856,943 | 1/1999 | Teng | 365/185.14 |

*Primary Examiner*—Viet Q. Nguyen
*Attorney, Agent, or Firm*—Ladas & Parry

[57] ABSTRACT

A method of erasing a split gate flash memory cell is provided, which can be used in the operation of a split gate flash memory cell to increase the number of its rewritable cycles. The improvement is remarkable especially for flash memory cells while its floating gate channel length is under a 0.4 μm-feature size. The erasing method includes the steps of: (i) applying a negative voltage to the control gate and applying a positive voltage to the drain to form a forward electrical field between the drain and the control gate; and (ii) applying a positive voltage to the source to reduce a voltage difference between the drain and the source, so that electrons in the floating gate are discharged under the effect of the forward electrical field generated by the Fowler-Nordheim tunneling effect, and hot holes can be reduced and prevented from accumulating in a tunnel oxide between the floating gate and the drain, thereby erasing the split-gate flash memory cell, and increasing the number of rewritable cycles for the flash memory cell.

8 Claims, 2 Drawing Sheets

METHOD FOR ERASING SPLIT-GATE FLASH MEMORY

BACKGROUND OF THE INVENTION

1. Field of the Invention

The present invention relates to a method for erasing a memory, and more particularly to a method for erasing a split-gate flash memory.

2. Description of Prior Art

During the operating process of conventional flash memory cells, electrons are normally pulled out of the floating gate by the Fowler-Nordhelm tunneling effect. Referring to FIG. 1, when erasing, the source terminal 10 remains floating or grounded according to the requirements of the circuit. A voltage of −12 volts is applied to the control gate 12. A voltage of 5 volts is applied to the drain 14. Thus the electrons in the floating gate 16 are discharged by the electrical field effect according to Fowler-Nordhelm tunneling effect. The holes gain energy and become hot holes due to the electrical field generated by the voltage difference between the control gate 12 and the drain 14, thus increasing the probability of capturing holes in the oxide layer.

Moreover, the intensity of the lateral electrical field increases since the channel becomes relatively short as the flash memory cell is shrunk. Consequently, the hot holes have a significant effect when the channel length is shorter than 0.8 μm, resulting in an inferior erasing efficiency. A split gate flash memory cell also having a short channel effect, for example when the channel length of floating gate is under 0.35 μm, is easily damaged since the probability of forming hot holes is markedly increased by the lateral electrical field while erasing.

Flash memory is widely used in notebook computers, digital cameras and digital mobile telephones, etc., due to its low power consumption and rapid access. However, the number of rewritable cycles for a flash memory must be increased for further applications. At present, the number of rewritable cycles for each flash memory is about 10,000. A 1000,000-cycle flash memory is needed to fabricate a desired silicon disk driver.

The reason that the flash memory can not be erased any more after several-thousand times of rewriting is that a large amount of hot holes are captured in the tunnel oxide while erasing, and the electrical field produced by the hot holes reduces the erasing efficiency. To reduce the hot hole trap formed during erasure, the energy that the holes gained while being accelerated by the electrical field must be effectively reduced.

Conventionally, a split gate flash memory is programmed by source side injection, such as the manner disclosed in "A new flash-erase EEPROM cell with a sidewall select-gate on its source side," Technical Digest of IEEE Electron Device Meeting 1988, by Naruka et al. Refer to FIG. 2, in which the programming is performed at the source side, that is, the source 10 is grounded, a voltage of 12 volts is applied to the control gate 12, a voltage of 5 volts is applied to the drain 14, and a voltage of 1.8 volts is applied to the select gate 18, thus the electrons can be injected from the source side into the floating gate 16. Conversely, the flash memory is erased by the Fowler-Nordhelm tunneling effect at the drain side. As described above, the rewritable cycle of the flash memory cell can be reduced because the amount of hot holes being captured increases.

Further, during the period of erasure, the holes produced by band-to-band tunneling current are accelerated by the lateral electrical field and become hot holes. The hot holes are attracted by the negative voltage applied to the control gate and then move upwardly to collide with the oxide layer and form many hole traps in the oxide. The electrical field produced by the holes stimulated in the oxide layer will block the electrical field formed between the drain and the control gate. Accordingly, the electrons in the floating gate can not be discharged effectively even when a positive voltage and a negative voltage are applied to the drain and the control gate, respectively. This results in a reduction of the number of rewritable cycles for a memory cell.

SUMMARY OF THE INVENTION

Accordingly, an object of the present invention is to provide a method of erasing a split gate flash memory cell, which can be used in the operation of a split gate flash memory cell to increase its number of rewritable cycles. The improvement is remarkable for the flash memory cell while its floating gate channel length is under the 0.4 μm-feature size.

To achieve the above object, this invention applies a balancing voltage to the source terminal of a flash memory cell to reduce the lateral electrical field, so as to diminish the acceleration of holes by the lateral electrical field and lower the probability of capturing hot holes in the tunnel oxide.

BRIEF DESCRIPTION OF THE DRAWINGS

The following detailed description, given by way of example and not intended to limit the invention solely to the embodiments described herein, will best be understood in conjunction with the accompanying drawings in which.

DETAILED DESCRIPTION OF THE PREFERRED EMBODIMENTS

Figure 1:
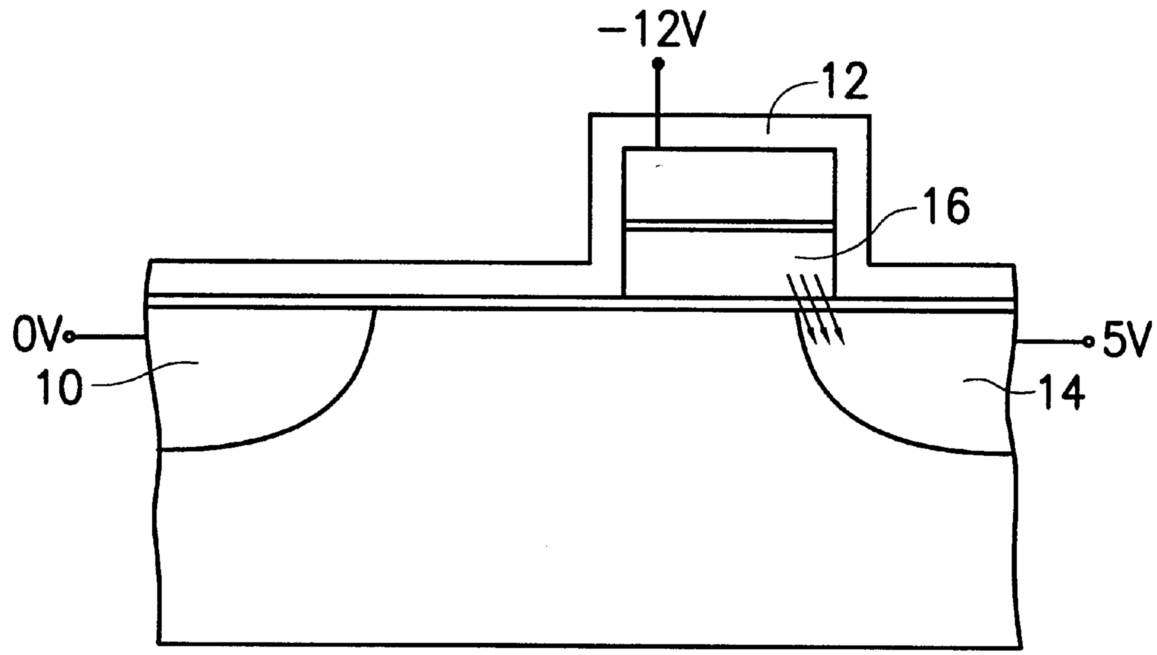
FIG. 1 is a diagram illustrating a conventional erasure operation for a flash memory cell.
Figure 2:
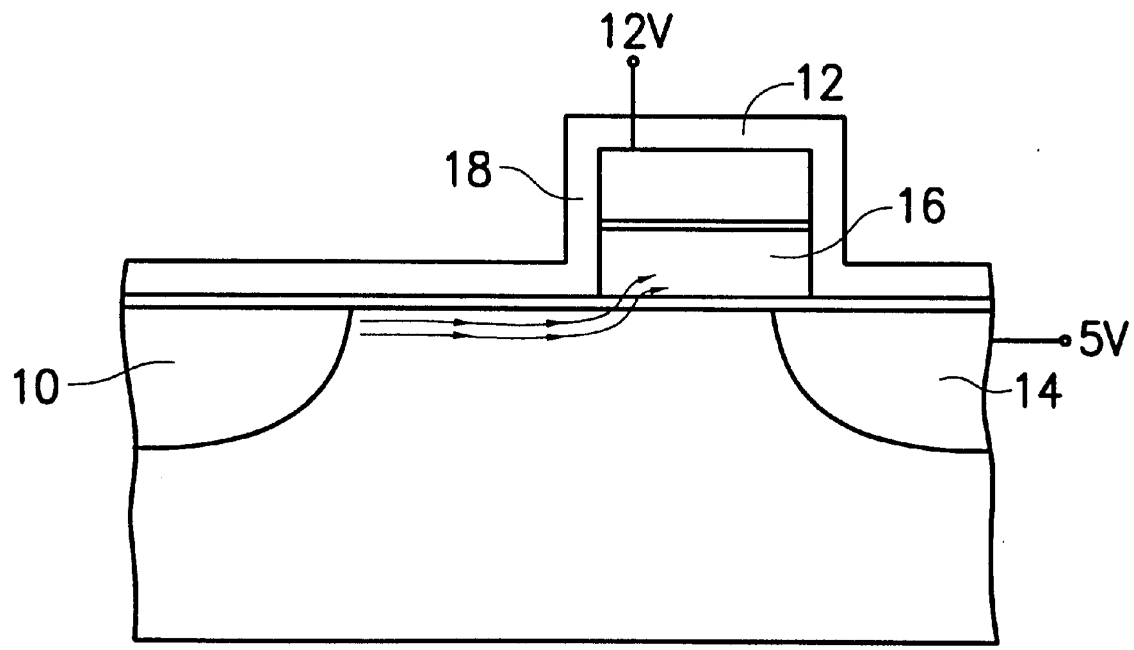
FIG. 2 is a diagram illustrating a conventional programming operation for a flash memory cell.
Figure 3:
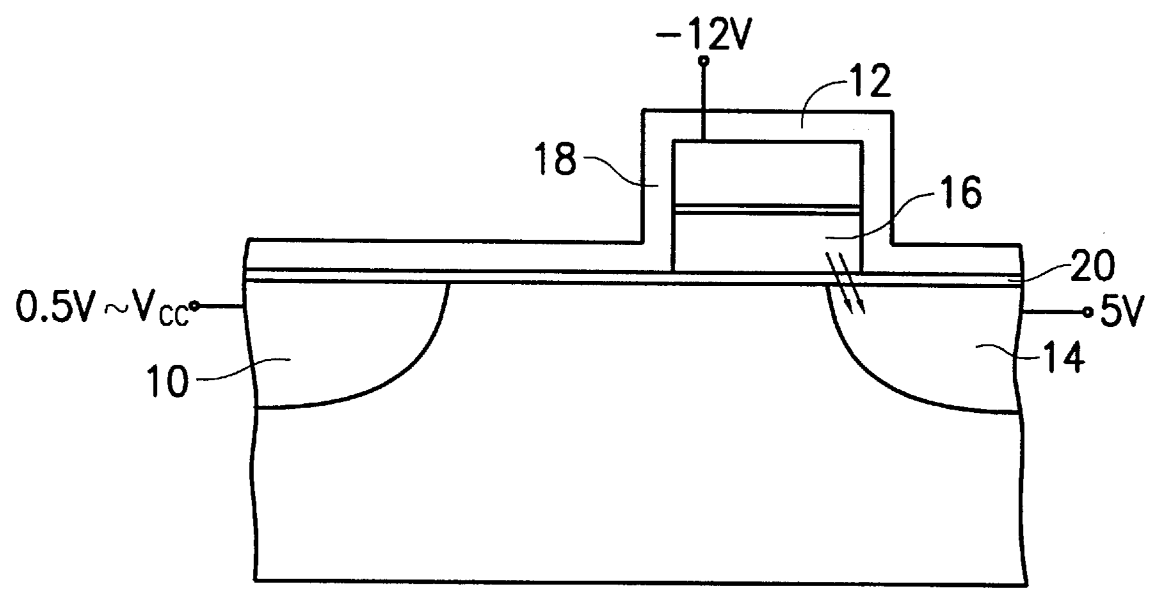
FIG. 3 is a diagram illustrating an erasure operation for a flash memory cell according to this invention.

Referring to FIG. 3, the method for erasing a split gate flash memory cell according to the present invention can be applied to a flash memory including a source 10, a control gate 12, a drain 14, a floating gate 16 and a select gate 18. The erasing method comprises the steps as described below.

First, like the conventional erasing method for a split gate flash memory cell, in this invention a negative voltage, e.g. −12 volts, is applied to the control gate 12 and also a positive voltage, e.g. 5 volts, is applied to the drain 14 to form a forward electrical field between the drain 14 and the control gate 12.

Then a positive voltage is applied to the source 10 to reduce the voltage difference between the drain 14 and the source 10. This can prevent holes from being accelerated by the lateral electrical field to become hot holes. Thus, the hot holes do not have enough energy to collide and be accumulated in the oxide layer 20. Without any hot hole accumulated in the oxide layer 20 it can not produce an electrical field to reduce the forward electrical field between the drain 14 and the control gate 12. Thereby the number of rewritable cycles of the split-gate flash memory cell can be increased.

In the above embodiment, while erasing the flash memory cell, the positive voltage applied to the source 10 is in a range of about 0.5 volts to power source voltage. However, the practical value of the voltage depends on the design of the circuitry. Whatever value of voltage is applied, applying a positive voltage to the source can effectively reduce the lateral electrical field, thus avoiding the generation of hot holes to damage the flash memory cell.

While the present invention has been particularly shown and described with reference to a preferred embodiment, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A method for erasing a split-gate flash memory cell that includes a source, a drain, a floating gate, a control gate and a select gate, comprising the steps of:

(i) applying a negative voltage to the control gate and applying a positive voltage to the drain to form a forward electrical field between the drain and the control gate; and (ii) applying a positive voltage to the source to reduce a voltage difference between the drain and the source, so that electrons in the floating gate are discharged under the effect of the forward electrical field generated by the Fowler-Nordheim tunneling effect, and hot holes can be reduced and prevented from accumulating in a tunnel oxide between the floating gate and the drain, thereby erasing the split-gate flash memory cell, and increasing the number of rewritable cycles for the flash memory cell.

2. A method for erasing a split-gate flash memory cell as claimed in claim 1 wherein the negative voltage applied to the control gate is −12 volts, the positive voltage applied to the drain is 5 volts and the positive voltage applied to the source is in a range of 0.5 volts to power supply voltage.

3. A method for erasing a split-gate flash memory cell as claimed in claim 1 wherein the split-gate flash memory cell is programmed through the source and erased through the drain.

4. A method for erasing a split-gate flash memory cell that includes a source, a drain, a floating gate, a control gate and a select gate, comprising the steps of applying a negative voltage to the control gate and applying a positive voltage to the drain to form a forward electrical field between the drain and the control gate; and then applying a positive voltage to the source to reduce a voltage difference between the drain and the source, so that electrons in the floating gate are discharged under the effect of the forward electrical field generated by the Fowler-Nordheim tunneling effect and the split-gate flash memory cell is erased, characterized in that hot holes can be reduced and prevented from accumulating in a tunnel oxide between the floating gate and the drain, thereby increasing the number of rewritable cycles for the flash memory cell.

5. A method for erasing a split-gate flash memory cell as claimed in claim 4 wherein the negative voltage applied to the control gate is −12 volts, the positive voltage applied to the drain is 5 volts and the positive voltage applied to the source is in a range of 0.5 volts to power supply voltage.

6. A method for erasing a split-gate flash memory cell that includes a source, a drain, a floating gate, a control gate and a select gate, wherein the split-gate flash memory cell is operated by applying a negative voltage to the control gate and applying a positive voltage to the drain to form a forward electrical field between the drain and the control gate; characterized by applying a positive voltage to the source to reduce a voltage difference between the drain and the source, so that electrons in the floating gate are discharged under the effect of the forward electrical field generated by the Fowler-Nordheim tunneling effect, and hot holes can be reduced and prevented from accumulating in a tunnel oxide between the floating gate and the drain, thereby erasing the split-gate flash memory cell, and increasing the number of rewritable cycles for the flash memory cell.

7. A method for erasing a split-gate flash memory cell as claimed in claim 6 wherein the negative voltage applied to the control gate is −12 volts, the positive voltage applied to the drain is 5 volts and the positive voltage applied to the source is in a range of 0.5 volts to power supply voltage.

8. A method for erasing a split-gate flash memory cell as claimed in claim 6 wherein the split-gate flash memory cell is programmed through the source and erased through the drain.

* * * * *